(12) United States Patent
Crane et al.

(10) Patent No.: US 6,657,031 B1
(45) Date of Patent: Dec. 2, 2003

(54) REWORKABLE THERMOSETTING RESIN COMPOSITIONS

(75) Inventors: Lawrence N. Crane, Brookfield, CT (US); Christopher K. Ober, Ithaca, NY (US); Young Cheol Bae, Ithaca, NY (US); Shuyan Yu, Hiroshima (JP); Jong-Wook Park, Chumgbuk (KR)

(73) Assignee: Loctite Corporation, Rocky Hill, CT (US)

(*) Notice: Subject to any disclaimer, the term of this patent is extended or adjusted under 35 U.S.C. 154(b) by 0 days.

(21) Appl. No.: 09/919,577

(22) Filed: Jul. 31, 2001

Related U.S. Application Data
(60) Provisional application No. 60/222,392, filed on Aug. 2, 2000.

(51) Int. Cl.⁷ ............................................... C08F 124/00
(52) U.S. Cl. ........................ 526/266; 526/204; 526/217; 526/321; 524/442
(58) Field of Search ................................. 526/266, 204, 526/217, 321; 524/442

(56) References Cited

U.S. PATENT DOCUMENTS

| | | | |
|---|---|---|---|
| 5,355,580 A | 10/1994 | Tsukada | 29/840 |
| 5,512,613 A | 4/1996 | Azali-Ardakani et al. | 523/443 |
| 5,560,934 A | 10/1996 | Azali-Ardakani et al. | 424/497 |
| 5,569,727 A | * 10/1996 | Mormann et al. | 525/528 |
| 5,700,581 A | * 12/1997 | Sachdev et al. | 428/447 |
| 5,760,337 A | 6/1998 | Iyer et al. | 174/52.2 |
| 5,783,867 A | 7/1998 | Belke Jr. et al. | 257/783 |
| 5,872,158 A | 2/1999 | Kuczyski | 522/182 |
| 5,932,682 A | 8/1999 | Buchwalter et al. | 528/94 |
| 5,948,922 A | 9/1999 | Ober et al. | 549/547 |
| 5,973,033 A | 10/1999 | Ober et al. | 523/443 |

FOREIGN PATENT DOCUMENTS

| | | | |
|---|---|---|---|
| GB | 2 338 240 | * 12/1999 | |
| JP | 49-76937 | * 7/1974 | |
| JP | 56-8062 | * 2/1981 | |
| JP | 3-245139 | * 10/1991 | |
| WO | 93/14134 | * 7/1993 | |
| WO | 99/35187 | * 7/1999 | |

OTHER PUBLICATIONS

Yang et al. Polymer Preprints (ACS, Division of Polymer Chem) (1997), 38(2), 440–441.*
Wang et al. Polymer Recycling (1999), Vol. Date 1998–1999, 4(4), 219–230.*
Strehmel et al. Thin Solid Films (1996), 284–285, 317–320.*
Lee et al. Polymer (1999), 40(11), 3197–3202.*
Yang et al. Chemistry of Materials (1998), 10(6), 1475–1482.*
Crane et al. IEEE Transactions on Components and Packaging Technologies (1999), 22(2), 163–167.*
Wong et al. J. of Applied Polymer Science (1999), 73(6), 997–1005.*

\* cited by examiner

*Primary Examiner*—Helen L. Pezzuto
(74) *Attorney, Agent, or Firm*—Webb Ziesenheim Logsdon Orkin & Hanson, P.C.

(57) ABSTRACT

This invention relates to thermosetting resin compositions useful for mounting semiconductor devices onto a circuit board, such as chip size or chip scale packages ("CSPs"), ball grid arrays ("BGAs"), land grid arrays ("LGAs"), and the like, each of which having a semiconductor chip, such as large scale integration ("LSI"), on a carrier substrate. The compositions of this invention are reworkable when subjected to appropriate conditions.

31 Claims, 2 Drawing Sheets

Reworkable Underfill Process Flow

Reworkable Underfill Process Flow

REWORKABLE THERMOSETTING RESIN COMPOSITIONS

CROSS-REFERENCE TO RELATED APPLICATION

The present invention claims priority to Provisional Application Serial No. 60/222,392 filed Aug. 2, 2000.

BACKGROUND OF THE INVENTION

1. Field of the Invention

This invention relates to thermosetting resin compositions useful for mounting semiconductor devices onto a circuit board, such as chip size or chip scale packages ("CSPs"), ball grid arrays ("BGAs"), land grid arays ("LGAs"), and the like, each of which having a semiconductor chip, such as large scale integration ("LSI"), on a carrier substrate. The compositions of this invention are reworkable when subjected to appropriate conditions.

2. Brief Description of Related Technology

In recent years, the popularity of small-sized electronic appliances, such as camera-integrated video tape recorders ("VTRs") and portable telephone sets, has made size reduction of LSI devices desirable. As a result, CSPs, BGAs, and LGAs are being used to reduce the size of packages substantially to that of bare chips. Such CSPs, BGAs, and LGAs improve the characteristics of the electronic device while retaining many of their operating features, thus serving to protect semiconductor bare chips, such as LSIs, and facilitate testing thereof.

Ordinarily, the CSP/BGA/LGA assembly is connected to electrical conductors on a circuit board by use of a solder connection or the like. However, when the resulting CSP/BGA/LGA circuit board structure is exposed to thermal cycling, the reliability of the solder connection between the circuit board and the CSP/BGA/LGA often becomes suspect. Recently, after a CSP/BGA/LGA assembly is mounted on a circuit board, the space between the CSP/BGA/LGA assembly and the circuit board is often now filled with a sealing resin (often referred to as underfill sealing) in order to relieve stresses caused by thermal cycling, thereby improving heat shock properties and enhancing the reliability of the structure.

However, since thermosetting resins are typically used as the underfill sealing material, in the event of a failure after the CSP/BGA/LGA assembly is mounted on the circuit board, it is very difficult to replace the CSP/BGA/LGA assembly without destroying or scrapping the structure in its entirety.

To that end, techniques for mounting a bare chip on a circuit board are accepted as substantially similar to the mounting of a CSP/BGA/LGA assembly onto a circuit board. One such technique, disclosed in Japanese Laid-Open Patent Publication No. 102343/93, involves a mounting process where a bare chip is fixed and connected to a circuit board by use of a photocurable adhesive, where, in the event of failure, this bare chip is removed therefrom. However, this technique is limited to those instances where the circuit board includes a transparent substrate (e.g., glass) which permits exposure to light from the back side, and the resulting structure exhibits poor heat shock properties.

Japanese Laid-Open Patent Publication No. 69280/94 discloses a process where a bare chip is fixed and connected to a substrate by use of a resin capable of hardening at a predetermined temperature. In the event of failure, this bare chip is removed from the substrate by softening the resin at a temperature higher than the predetermined temperature. However, no specific resin is disclosed, and there is no disclosure about treating the resin which remains on the substrate. Thus, the disclosed process is at best incomplete.

As pointed out in Japanese Laid-Open Patent Publication No. 77264/94, it is conventional to use a solvent to remove residual resin from a circuit board. However, swelling the resin with a solvent is a time consuming process and the corrosive organic acid ordinarily used as the solvent may reduce the reliability of the circuit board. Instead, that disclosure speaks to a method for removing residual resin by irradiation with electromagnetic radiation.

Japanese Laid-Open Patent Publication No. 251516/93 also discloses a mounting process using bisphenol A type epoxy resin (CV5183 or CV5183S; manufactured by Matsushita Electric Industrial Co., Ltd.). However, the removal process so disclosed does not consistently permit easy removal of the chip, the curing step is lengthy at elevated temperatures, and the process generally results in poor productivity.

Of course, mechanical methods of removing/replacing semiconductor chips from/on a substrate are known, such as by cutting the chip to be removed/replaced. See U.S. Pat. No. 5,355,580 (Tsukada).

Thermoplastic underfill resins are known for use in semiconductor chip attachment. See U.S. Pat. No. 5,783,867 (Belke, Jr.). However, such thermoplastic resins tend to leak under relatively modest temperature conditions. In contrast, thermosetting resins cure into a matrix which ordinarily have greater thermal stability under end use operating temperatures.

U.S. Pat. Nos. 5,512,613 (Afzali-Ardakani), 5,560,934 (Afzali-Ardakani), and 5,932,682 (Buchwalter), each refer to a reworkable thermoset composition based on a diepoxide component in which the organic linking moiety connecting the two epoxy groups of the diepoxide includes an acid cleavable acyclic acetal group. With such acid cleavable acyclic acetal groups forming the bases of the reworkable composition, a cured thermoset need only be introduced to an acidic environment in order to achieve softening and a loss of much of its adhesiveness.

U.S. Pat. No. 5,872,158 (Kuczynski) refers to thermosetting compositions capable of curing upon exposure to actinic radiation, which are based on acetal diacrylates, and reaction products of which are reported to be soluble in dilute acid.

U.S. Pat. No. 5,760,337 (Iyer) refers to thermally reworkable crosslinked resins to fill the gap created between a semiconductor device and a substrate to which it is attached. These resins are produced by reacting a dienophile (with a functionality greater than 1) with a 2.5-dialkyl substituted furan-containing polymer.

International Patent Publication No. PCT/US98/00858 refers to a thermosetting resin composition capable of sealing underfilling between a semiconductor device including a semiconductor chip mounted on a carrier substrate and a circuit board to which said semiconductor device is electrically connected. The composition includes about 100 parts by weight of an epoxy resin, about 3 to about 60 parts by weight of a curing agent, and about 1 to about 90 parts by weight of a plasticizer. Here, the area around the cured thermoset is to be heated at a temperature of about 190 to about 260° C. for a period of time ranging from about 10 seconds to about 1 minute in order to achieve softening and a loss of much of its adhesiveness.

U.S. Pat. Nos. 5,948,922 (Ober) and 5,973,033 (Ober) each refer to a certain class of compounds having tertiary oxycarbonyl linkages, and compositions based on such compounds, which when cured provide decomposable compositions capable of being reworked.

Notwithstanding the state of the art, it would be desirable for an underfilling sealing material to provide good productivity and thermal shock properties, while allowing the substrates with which it is to be used to be readily processed and easily separated from a semiconductor device without application of acidic media or elevated temperature conditions that may compromise the integrity of the semiconductor devices remaining on the substrate or the substrate itself.

SUMMARY OF THE INVENTION

The present invention provides a curable composition, which is reworkable through thermal decomposition under exposure to temperature conditions in excess of those used to cure the composition, with the curable composition including a compound having at least one thermally cleavable linkage and which is selected from:

a)

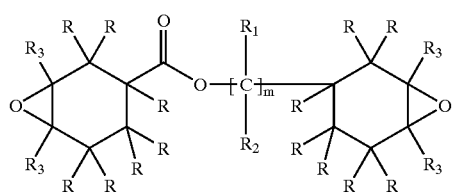

I where each R is independently selected from hydrogen, methyl, ethyl, propyl, isopropyl, butyl, isobutyl, tert-butyl, $C_{1-4}$ alkoxy, halogen, cyano and nitro; each $R_3$ is independently selected from hydrogen, methyl, ethyl, propyl, and isopropyl; $R_1$ and $R_2$ are each independently selected from hydrogen, methyl, ethyl, propyl, phenyl, tolyl, and benzyl, provided that at least one of $R_1$ and $R_2$ is phenyl, tolyl or benzyl, and m is 1;

b)

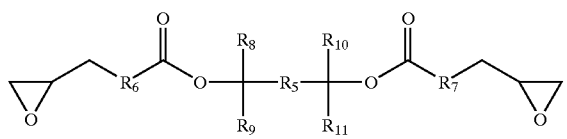

III where $R_5$ is phenylene, $R_6$ and $R_7$ are each independently selected from methylene, ethylene, propylene, or phenylene; $R_8$ and $R_9$ are each independently selected from hydrogen, methyl, ethyl, and propyl, provided that both $R_8$ and $R_9$ cannot be hydrogen; and $R_{10}$ and $R_{11}$ are each independently selected from hydrogen, methyl, ethyl, and propyl, provided that both $R_{10}$ and $R_{11}$ cannot be hydrogen; and c)

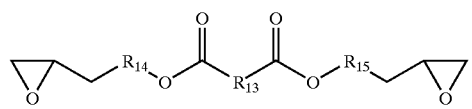

VII where $R_{13}$ is phenylene, and $R_{14}$ and $R_{15}$ are independently selected from secondary or tertiary aliphatic moieties.

The invention further relates to the curable compounds themselves. Particularly desirable curable compounds within the above formulas are given in the section entitled "Detailed Description of the Invention," which follows hereinafter.

In a further aspect, the curable compound is incorporated into a thermosetting resin composition, which is used as an underfill sealant between a semiconductor device and a circuit board to which the semiconductor device is electrically connected. Such a thermosetting resin composition includes, broadly, a curable resin component, a portion of which is a curable compound having at least one thermally cleavable linkage as described above; an optional inorganic filler component; and a curing agent component including an anhydride component, a nitrogen-containing component, such as an amine compound, an amide compound, and/or an imidazole compound, and combinations thereof.

Reaction products of these compositions are capable of softening under exposure to elevated temperature conditions, such as in excess of the temperatures used to cure the composition. Such temperature exposure combined with the curable compound having at least one thermally cleavable linkage provides the reworkable aspect of this invention. The remaining components, discussed below, provide the physical properties and characteristics for the compositions and reaction products to render the compositions attractive for commercial use, particularly in the microelectronics industry. Of course, the compositions may also be used for other microelectronic assembly applications, such as the direct chip attach applications, including glob top, and dam and fill. In addition, the compositions may be used in far-flung applications, where the thermosetting epoxies, or for that matter other thermosetting or thermoplastic adhesive, coating, and sealant compositions, may be used.

For instance, the compositions may be used in the assembly of products, whose component parts have value as do the intermediate/finished products, to facilitate assembly and disassembly thereof where defective component parts are found. In that event, the defective component part(s) may be readily removed from the intermediate/finished product(s) and be replaced without having to scrap the entire intermediate/finished product(s).

In addition, the speed with which the disassembly may proceed allows throughput to remain high. A non-microelectronic example of such a part is the assembly of prosthetic devices.

In a further aspect of the invention, the curable compound with at least one thermally cleavable linkage includes an aromatic moiety within the structure. Here, the thermally cleavable linkage of the desirable compound is desirably chosen from aromatic ester linkages and aliphatic ester linkages including an aromatic moiety within the structure. Particularly desirable are those compounds identified in formula I where at least one of $R_1$ and $R_2$ is phenyl, tolyl or benzyl and m is 1, as well as those compounds within formulas III, VIII, and IX given in the "Detailed Description of the Invention."

The inventive thermosetting resin composition is useful as an underfilling sealing resin, and enables a semiconductor device, such as a CSP/BGA/LGA assembly which includes a semiconductor chip mounted on a carrier substrate, to be securely connected to a circuit board by short-time heat curing and with good productivity. Reaction products of the inventive compositions demonstrate excellent heat shock properties (or thermal cycle properties), and permit the semiconductor device to be easily removed from the circuit board by localized heating in the event of semiconductor device or connection failure. This makes it possible to reuse the circuit board (with the remaining functioning semiconductor devices still electrically attached) and thereby achieve an improvement in the yield of the production process and a reduction in production cost.

The compositions of this invention may also be used for microelectronic applications beyond sealing underfill, such as with glob top, die attachment, and other applications for thermosetting compositions in which rapid cure time and an extended useful working life are desirable.

Other benefits and advantages of the present invention will become more readily apparent after a reading of the "Detailed Description of the Invention" section together with the figures.

DETAILED DESCRIPTION OF THE INVENTION

Figure 1:
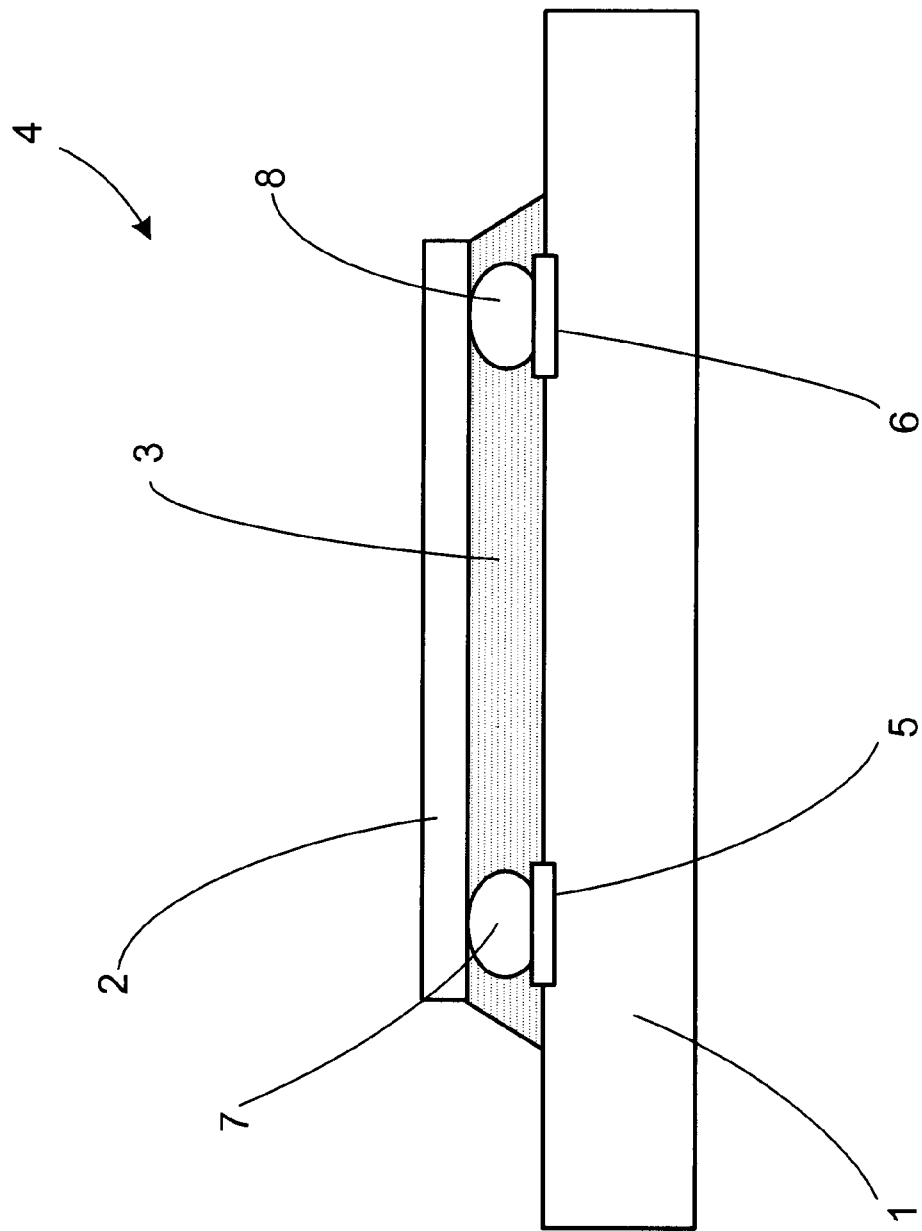
FIG. 1 depicts a cross-sectional view showing an example of the mounting structure in which the thermosetting resin composition of the present invention is used.

As noted above, the present invention provides compounds which include at least one thermally cleavable linkage, and which are useful in curable compositions. In particular, such compounds are useful in compositions which can be cured, such as, for example, underfill sealants between a semiconductor device and a circuit board to which the semiconductor device is electrically connected. Further, the compounds provide the curable compositions with the capability of being reworkable through thermal decomposition, when the compositions are exposed to temperature conditions in excess of those used to cure the composition. The invention is directed to the curable compounds themselves, as well as curable compositions incorporating such curable compounds therein.

Useful compounds include those with at least one thermally cleavable linkage including an aromatic moiety within the chain structure. Such curable compounds are defined by the following formula:

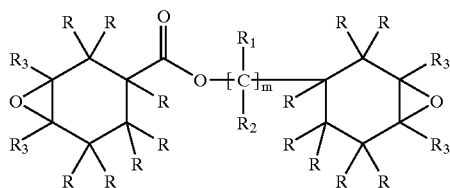

I where each R is independently selected from hydrogen, methyl, ethyl, propyl, isopropyl, butyl, isobutyl, tert-butyl, $C_{1-4}$ alkoxy, halogen, cyano and nitro; each $R_3$ is independently selected from hydrogen, methyl, ethyl, propyl, and isopropyl; $R_1$ and $R_2$ are each independently selected from hydrogen, methyl, ethyl, propyl, phenyl, tolyl, and benzyl, provided that both $R_1$ and $R_2$ cannot be hydrogen and at least one of $R_1$ and $R_2$ is phenyl, tolyl or benzyl, and m is 1. For example, particularly desirable compounds are curable compositions having the following structure:

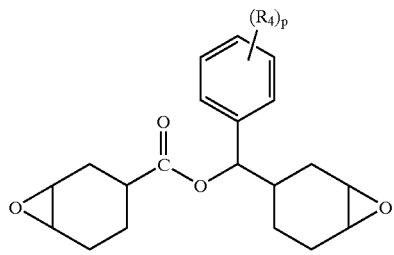

II where $R_4$ is hydrogen, methyl, ethyl, propyl, and tert-butyl, and p is 1–5. Such compounds can be prepared by reacting acid chlorides with alcohols having an aromatic secondary linkage.

For example, these curable compounds can be prepared from cycloaliphatic diene esters having the following formula:

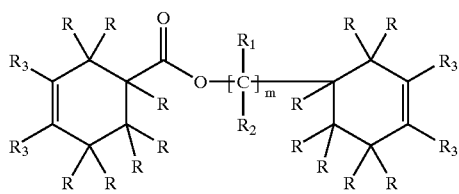

where R, $R_1$, $R_2$, $R_3$, and m are as given above, which themselves are the condensation product of an alcohol within formula A below:

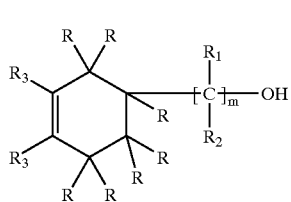

A where R, $R_1$, $R_2$, $R_3$, and m are as given above, with an acid chloride within formula B below:

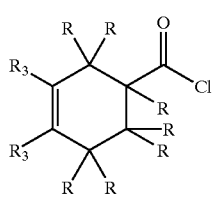

B where R and $R_3$ are as given above. The condensation reaction is ordinarily performed in an anhydrous polar solvent at a temperature ranging from 0 to 20° C. for a time period ranging from 6 to 18 hours.

To epoxidize the diene ester, a peracid (such as peracetic acid, perbenzoic acid, meta-chloroperbenzoic acid, and the like) may be used, with the reaction carried out until epoxidization of diene ester occurs, typically within a period of time of from 2 to 18 hours.

More desirably, the compound having at least one thermally cleavable linkage includes two oxycarbonyl groups, the first and second oxycarbonyl groups being separated by an aromatic moiety. Such compounds may be chosen from aromatic ester linkages and aliphatic ester linkages with the aromatic moiety being present within the network structure. Particularly desirable are tert-ester linkages incorporating an aromatic moiety.

Desirable compounds having two oxycarbonyl groups separated by an aromatic moiety include those having the following structure:

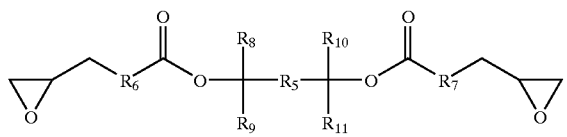
III where $R_5$ is phenylene; $R_6$ and $R_7$ are each independently selected from methylene, ethylene, propylene, or phenylene; $R_8$ and $R_9$ are each independently selected from hydrogen, methyl, ethyl, and propyl, provided that both $R_8$ and $R_9$ cannot be hydrogen; and $R_{10}$ and $R_{11}$ are each independently selected from hydrogen, methyl, ethyl, and propyl, provided that both $R_{10}$ and $R_{11}$ cannot be hydrogen.

In particularly desirable compounds, $R_5$ is meta-substituted phenyl group, a para-substituted phenyl group, or an ortho-substituted phenyl group.

Examples of particularly useful compositions within formula III include those of the following formulas:

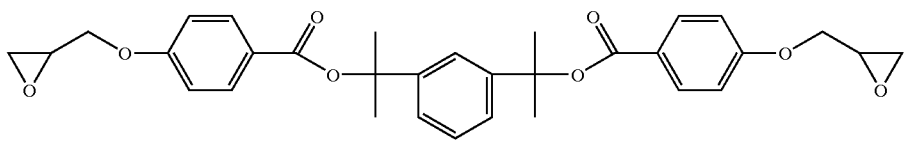
IV

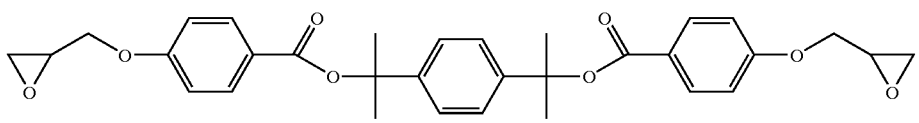
V

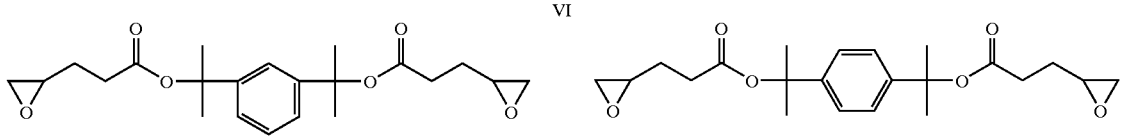
VI VII

These compounds can be prepared from aromatic acid diesters having the following formula:

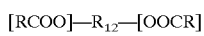
[RCOO]—$R_{12}$—[OOCR]

where $R_{12}$ is an aryl group and R is an alkyl or aryl group, which is a reaction product of a tertiary alcohol or alkoxide such as a tert-(lithium) alkoxide within the formula C:

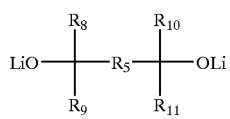
C wherein $R_5$ is an aromatic moiety and $R_8$, $R_9$, $R_{10}$, and $R_{11}$ are as given above, with an acid chloride within the formula D:

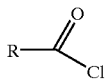
D wherein R is as given above. The reaction is ordinarily performed in an anhydrous polar solvent at a temperature ranging from 0 to 20° C. for a time period ranging from 6 to 18 hours.

Formation of an epoxide from the aromatic acid diester can be accomplished as discussed above with respect to the diene esters.

Additional desirable compounds include those having the following formula:

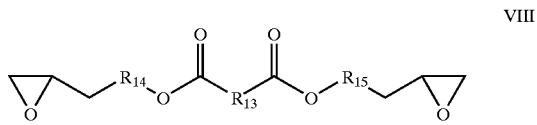
VIII where $R_{13}$ is phenylene, and $R_{14}$ and $R_{15}$ are independently selected from secondary or tertiary aliphatic moieties. For example, desirable compounds include those having the formula:

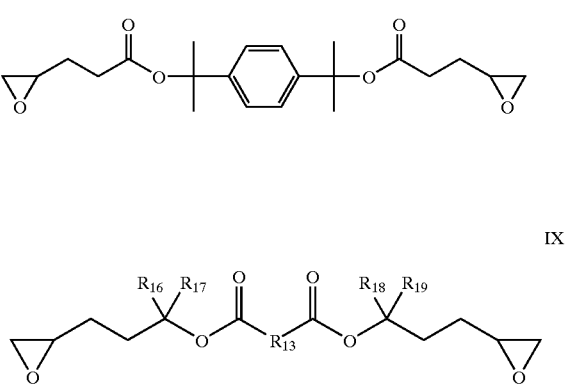
IX where $R_{13}$ is phenylene; $R_{16}$ and $R_{17}$ are each independently selected from hydrogen, methyl, ethyl or propyl, provided that both $R_{16}$ and $R_{17}$ cannot be hydrogen; and $R_{18}$ and $R_{19}$ are each independently selected from hydrogen, methyl, ethyl, or propyl, provided that both $R_{18}$ and $R_{19}$ cannot be hydrogen.

In particularly desirable compositions, $R_{13}$ is a meta-substituted phenyl group, a para-substituted phenyl group, or an ortho-substituted phenyl group.

Examples of particularly useful compositions within formula IX include:

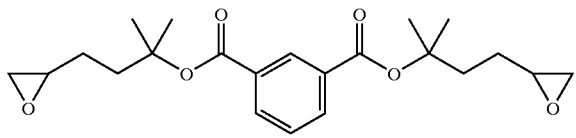

X

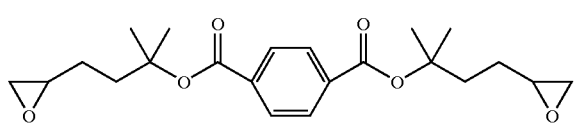

XI

These compounds can be prepared by reacting secondary or tertiary alcohols or alkoxides with an aromatic diacid chloride. Formation of an epoxide from the reaction product can be accomplished as discussed above.

As noted above, the compounds of the present invention are particularly useful in curable compositions, such as thermosetting resin compositions which are useful as underfill sealants between a semiconductor device and a circuit board to which the semiconductor device is electrically connected. Thus, in a further aspect of the present invention, a thermosetting resin composition is provided, which includes broadly (a) a curable resin component, a portion of which is a curable compound having at least one thermally cleavable linkage as discussed in detail above; (b) an optional inorganic filler component; and (c) a curing agent component including an anhydride component, a nitrogen-containing component, such as an amine compound, an amide compound, or an imidazole compound, and/or combinations thereof Reaction products of these compositions are capable of softening under exposure to elevated temperature conditions, such as in excess of the temperature chosen to cure the composition. Loss of adhesion to the substrate occurs at temperatures greater than that which was used to cure the composition. For instance, at least about 50% of adhesion to the substrate is typically lost at temperatures in excess of about 200° C.

The presence in the curable resin component of the curable compound(s) with at least one thermally cleavable linkage allows for repair, replacement, recovery, and/or recycling of operative electronic components from assemblies that have become at least in part inoperative.

As set forth above, the curable compound is desirably selected from epoxy compounds.

Typically, the composition includes about 10 to about 60 weight percent of the resin component by weight of the total composition, of which about 25 to about 75 weight percent thereof is comprised of a curable compound having at least one thermally cleavable linkage; about 0 to about 60 weight percent of the inorganic filler component; and 0.01 to about 60 weight percent of the curing agent component, of which about 0 to about 60 weight percent thereof is comprised of an anhydride compound, 0 to about 5 weight percent thereof is comprised of an amide compound, such as a cyano-functionalized amide, like dicyandamide, and 0 to about 2 weight percent thereof is comprised of an imidazole compound.

Of course, depending on the particular set of properties desirable for a composition destined for a specific purpose, these values may vary somewhat. Such variation may be achieved without undue experimentation by those persons skilled in the art, and accordingly are contemplated within the scope of the present invention.

The curable resin component of the present invention may be an epoxy resin component and may include any common epoxy resin, such as a multifunctional epoxy resin. Ordinarily, the multifunctional epoxy resin should be included in an amount within the range of about 15 weight percent to about 75 weight percent of the total of the epoxy resin component. In the case of bisphenol-F-type epoxy resin, desirably the amount thereof should be in the range of from about 35 to about 65 weight percent, such as about 40 to about 50 weight percent of the total of the epoxy resin component.

Examples of the multifunctional epoxy resin include bisphenol-A-type epoxy resin, bisphenol-F-type epoxy resin (such as RE-404-S from Nippon Kayaku, Japan), phenol novolac-type epoxy resin, and cresol novolac-type epoxy resin (such as "ARALDITE" ECN 1871 from Ciba Specialty Chemicals, Hawthorne, N.Y.).

Other suitable epoxy resins include polyepoxy compounds based on aromatic amines and epichlorohydrin, such as N,N,N',N'-tetraglycidyl-4,4'-diaminodiphenyl methane; N-diglycidyl-4-aminophenyl glycidyl ether; and N,N,N',N'-tetraglycidyl-1,3-propylene bis-4-aminobenzoate.

Among the epoxy resins suitable for use herein also include polyglycidyl derivatives of phenolic compounds, such as those available commercially under the tradename "EPON", such as "EPON" 828, "EPON" 1001, "EPON" 1009, and "EPON" 1031 from Shell Chemical Co.; "DER" 331, "DER" 332, "DER" 334, and "DER" 542 from Dow Chemical Co.; and BREN-S from Nippon Kayaku. Other suitable epoxy resins include polyepoxides prepared from polyols and the like and polyglycidyl derivatives of phenol-formaldehyde novolacs, the latter of which are available commercially under the tradename "DEN", such as "DEN" 431, "DEN" 438, and "DEN" 439 from Dow Chemical. Cresol analogs are also available commercially under the tradename "ARALDITE", such as "ARALDITE" ECN 1235, "ARALDITE" ECN 1273, and "ARALDITE" ECN 1299 from Ciba Specialty Chemicals Corporation. SU-8 is a bisphenol-A type epoxy novolac available from Interez, Inc. Polyglycidyl adducts of amines, aminoalcohols, and polycarboxylic acids are also useful in this invention, commercially available resins of which include "GLYAMINE" 135, "GLYAMINE" 125, and "GLYAMINE" 115 from F.I.C. Corporation; "ARALDITE" MY-720, "ARALDITE" 0500, and "ARALDITE" 0510 from Ciba Specialty Chemicals, and PGA-X and PGA-C from the Sherwin-Williams Co.

And, of course, combinations of the different epoxy resins are also desirable for use herein.

As an inorganic filler component, many materials are potentially useful. For instance, the inorganic filler component may often include reinforcing silicas, such as fused silicas, and may be untreated or treated so as to alter the chemical nature of their surface. Virtually any reinforcing fused silica may be used.

Particularly desirable ones have a low ion concentration and are relatively small in particle size (e.g., in the range of about 2–10 microns, such as on the order of about 2 microns), such as the silica commercially available from Admatechs, Japan under the trade designation SO-E5.

Other desirable materials for use as the inorganic filler component include those constructed of or containing aluminum oxide, silicon nitride, aluminum nitride, silica-coated aluminum nitride, boron nitride, and combinations thereof.

The curing agent component should include materials capable of catalyzing the polymerization of the epoxy resin component of the inventive compositions. Desirable curing agents for use with the present invention include an anhydride component, a nitrogen-containing component, such as an amine compound, an amide compound, and an imidazole compound, and combinations thereof.

Appropriate anhydride compounds for use herein include mono- and poly-anhydrides, such as hexahydrophthalic anhydride ("HHPA") and methyl hexahydrophthalic anhydride ("MHHPA") (commercially available from Lindau Chemicals, Inc., Columbia, S.C., used individually or as a combination, which combination is available under the trade designation "LINDRIDE" 62C) and 5-(2,5-dioxotetrahydrol)-3-methyl-3-cyclohexene-1,2-dicarboxylic anhydride (commercially available from ChrisKev Co., Leewood, Kans. under the trade designation B-4400).

Of course, combinations of these anhydride compounds are also desirable for use in the compositions of the present invention.

Examples of the amine compounds include aliphatic polyamines, such as diethylenetriamine, triethylenetetramine and diethylaminopropylamine; aromatic polyamines, such as m-xylenediamine and diaminodiphenylamine; and alicyclic polyamines, such as isophoronediamine and menthenediamine.

In embodiments of the present invention where an aromatic moiety is included within the curable resin component structure, aromatic polyamines, and alicyclic polyamines are desirable as curing agents, particularly 4,4'-methylenedianiline ("MDA") and 4,4'methylenebis(cyclohexylamine) ("MCA"). Of course, combinations of these amine compounds are also desirable for use in the compositions of the present invention.

Examples of amide compounds include cyano-functionalized amides, such as dicyandiamide.

The imidazole compounds may be chosen from imidazole, isoimidazole, and substituted imidazoles—such as alkyl-substituted imidazoles (e.g., 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms), and aryl-substituted imidazoles [e.g., phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-napnthyl-4,5-diphenylimidazole, 1-benzyl-2-methylimidazole, 2-p-methoxystyrylimidazol and the like, generally where each aryl substituent contains up to about 10 carbon atoms and desirably up to about 8 carbon atoms].

Examples of commercial imidazole compounds are available from Air Products, Allentown, Pa. under the trade designation "CUREZOL" 1B2MZ; from Synthron, Inc., Morganton, N.C. under the trade designation "ACTIRON" NXJ-60; and from Borregaard Synthesis, Newburyport, Mass. under the trade designation "CURIMID CN."

Of course, combinations of these imidazole compounds are also desirable for use in the compositions of the present invention.

The curing agent component may be used in an amount of from about 5 to about 40 parts by weight, per 100 parts of the epoxy resin.

In addition, the composition may also include a flowability agent, such as a silane and/or titanate.

Appropriate silanes for use herein include octyl trimethoxy silane (commercially available from OSI Specialties Co., Danbury, Conn. under the trade designation A-137), and methacryloxy propyl trimethoxy silane (commercially available from OSI under the trade designation A-174).

Appropriate titanates for use herein include titanium IV tetrakis [2,2-bis[(2-propenyloxy)methyl]-1-butanolato-0] [bis(ditridecylphosphito-0), dihydrogen]$_2$ (commercially available from Kenrich Petrochemical Inc., Bayonne, N.J. under the trade designation KR-55).

When used, the flowability agent may be used in an amount of 0 to about 2 parts by weight, per 100 parts of the epoxy resin.

In addition, adhesion promoters, such as the silanes, glycidyl trimethoxysilane (commercially available from OSI under the trade designation A-187), or gamma-amino propyl triethoxysilane (commercially available from OSI under the trade designation A-1100),may be used.

Cyanate esters may also be used in the inventive compositions. The cyanate esters useful as a component in the inventive compositions may be chosen from dicyanatobenzenes, tricyanatobenzenes, dicyanatonaphthalenes, tricyanatonaphthalenes, dicyanatobiphenyl, bis(cyanatophenyl)methanes and alkyl derivatives thereof, bis(dihalocyanatophenyl)propanes, bis(cyanatophenyl)ethers, bis(cyanatophenyl)sulfides, bis(cyanatophenyl)propanes, tris(cyanatophenyl)phosphites, tris(cyanatophenyl)phosphates, bis(halocyanatophenyl) methanes, cyanated novolac, bis[cyanatophenyl (methylethylidene)]benzene, cyanated bisphenol-terminated thermoplastic oligomers, and combinations thereof.

More specifically, aryl compounds having at least one cyanate ester group on each molecule may be generally represented by the formula $Ar(OCN)_m$, where Ar is an aromatic radical and m is an integer from 2 to 5. The aromatic radical Ar should contain at least 6 carbon atoms, and may be derived, for example, from aromatic hydrocarbons, such as benzene, biphenyl, naphthalene, anthracene, pyrene, or the like. The aromatic radical Ar may also be derived from a polynuclear aromatic hydrocarbon in which at least two aromatic rings are attached to each other through a bridging group. Also included are aromatic radicals derived from novolac-type phenolic resins (i.e., cyanate esters of these phenolic resins). The aromatic radical Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanato-biphenyl; bis(4-cyanatophenyl)methane and 3,3', 5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-

(methylethylidene)]benzene and cyanated bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Patent No. 1,305,702; and the cyanate esters disclosed in International Patent Publication WO 85/02184, the disclosure of each of which is hereby expressly incorporated herein by reference. Of course, combinations of these cyanate esters within the imidazole component of the compositions of the present invention are also desirably employed herein.

A particularly desirable cyanate ester for use herein is available commercially from Ciba Specialty Chemicals, Tarrytown, N.Y. under the tradename "AROCY" L10 [1,1-di(4-cyanatophenylethane)].

When used, the cyanate esters may be used in an amount of about 1 to about 20 weight percent based on the total amount of the epoxy resin component.

Conventional additives may also be used in the compositions of the present invention to achieve certain desired physical properties of the composition, the cured reaction product, or both.

For instance, it may be desirable in certain instances (particularly where a large volume of inorganic filler component is used) to include a reactive co-monomer component for the epoxy resin component, such as a reactive diluent.

Appropriate reactive diluents for use herein may include monofunctional or certain multifunctional epoxy resins. The reactive diluent should have a viscosity which is lower than that of the epoxy resin component. Ordinarily, the reactive diluent should have a viscosity less than about 250 cps. In the event such a monofunctional epoxy resin is included as a reactive diluent, such resin should be employed in an amount of up to about 50 parts based on the total of the epoxy resin component.

The monofunctional epoxy resin should have an epoxy group with an alkyl group of about 6 to about 28 carbon atoms, examples of which include $C_{6-28}$ alkyl glycidyl ethers, $C_{6-28}$ fatty acid glycidyl esters, and $C_{6-28}$ alkylphenol glycidyl ethers.

Commercially available monofunctional epoxy resin reactive diluents include those from Pacific Epoxy Polymers, Richmond, Mich., under the trade designations PEP-6770 (glycidyl ester of neodecandoic acid), PEP-6740 (phenyl glycidyl ether), and PEP-6741 (butyl glycidyl ether).

Commercially available multifunctional epoxy resin reactive diluents include those from Pacific Epoxy Polymers, under the trade designations PEP-6752 (trimethylolpropane triglycidyl ether) and PEP-6760 (diglycidyl aniline).

The compositions of the present invention may further contain other additives, such as defoaming agents, leveling agents, dyes, and pigments. Moreover, photopolymerization initiators may also be incorporated therein, provided that such initiators do not adversely affect the properties of the composition or reaction products formed therefrom.

The thermosetting resin compositions of the present invention may be of the one-pack type, in which all the ingredients are mixed together, or of the two-pack type in which the curable component(s) is(are) included in one part and the curing agent is stored separately in a second part, and mixed together only prior to use.

During application, the thermosetting resin compositions according to the present invention penetrate and flow readily into the space between the semiconductor chip and the circuit board, or at least show a reduction in viscosity under heated or use conditions thus penetrating and flowing easily.

Generally, it is desirable to prepare thermosetting resin compositions of this invention by selecting the types and proportions of various components to reach a viscosity at a temperature of 25° C. in the range of 500 to 70,000 cps, such as 800 to 3,000 cps, depending on the amount present (if any) of an inorganic filler component, so as to improve its ability to penetrate into the space (e.g., of 10 to 200 $\mu$m) between the circuit board and the semiconductor device. At this viscosity, the gel times of the compositions will also be tailored to a specified period of time (such as 15 seconds, or 1 or 2 minutes) at a temperature of about 150° C. In such case, the inventive compositions should show no or substantially no increase of viscosity after a period of time of about six hours. With such a gel time, the compositions penetrate into the space (e.g., of 10 to 200 $\mu$m) between the circuit board and the semiconductor device relatively rapidly, and allow for a greater number of assemblies to be filled without observing a viscosity increase in the composition thereby rendering it less effective for application.

Reference to FIG. 1 shows a mounted structure (i.e., an FC package) in which a thermosetting resin composition of the present invention has been applied and cured.

The FC package 4 is formed by connecting a semiconductor chip (a bare chip) 2 to a carrier substrate 1 (e.g., a circuit board) and sealing the space therebetween suitably with a thermosetting resin composition 3.

More specifically, for example, in the assembly of FC semiconductor devices using SBB technology, the semiconductor chip 2 may be passed over a substrate bearing a conductive adhesive paste (such as a metal-filled epoxy) to form a layer thereof on the semiconductor chip 2. The layer is ordinarily formed by a printing mechanism. The conductive adhesive paste may be applied on either the carrier substrate or the semiconductor chip. One way to do this is with the stencil claimed and described in International Patent Publication No. PCT/FR95/00898. Alternatively, this connection may also be made by an anisotropically conductive adhesive. See International Patent Publication No. PCT/US97/13677.

Thereafter, the semiconductor chip 2 is positioned over the carrier substrate 1 in such a manner so that the semiconductor chip 2 is in alignment with electrodes 5 and 6 on the carrier substrate 1, now coated with a patterned layer of conductive adhesive paste or solder 7 and 8. The conductive adhesive paste may be cured by a variety of ways, though ordinarily a heat cure mechanism is employed.

In order to improve reliability, the space between the semiconductor chip 2 and the carrier substrate 1 is sealed with a thermosetting resin composition 3. The cured product of the thermosetting resin composition should completely fill that space.

The semiconductor chip ordinarily may be coated with a polyimide-, benzocyclobutane-, or silicone nitride-based material to passivate environmental corrosion.

Carrier substrates may be constructed from ceramic substrates of $Al_2O_3$, $SiN_3$, and mullite ($Al_2O_3$-$SiO_2$); substrates or tapes of heat-resistant resins, such as polyimides; glass-reinforced epoxy; ABS and phenolic substrates which are also used commonly as circuit boards; and the like. Any electrical connection of the semiconductor chip to the carrier substrate may be used, such as connection by a high-melting solder or electrically (or anisotropically) conductive adhesive and the like. In order to facilitate connections, particularly in SBB technology, the electrodes may be formed as wire bond bumps.

After the semiconductor chip is electrically connected to the carrier substrate, the resulting structure is ordinarily subjected to a continuity test or the like. After passing such test, the semiconductor chip may be fixed thereto with a thermosetting resin composition, as described below. In this way, in the event of a failure, the semiconductor chip may be removed before it is fixed to the carrier substrate with the thermosetting resin composition.

Using a suitable application means, such as a dispenser, a thermosetting resin composition in accordance with this invention is applied to the periphery of the electronically-connected semiconductor chip. The composition penetrates by capillary action into the space between the carrier substrate and the semiconductor chip.

The thermosetting resin composition is then thermally cured by the application of heat. During the early stage of this heating, the thermosetting resin composition shows a significant reduction in viscosity and, hence, an increase in fluidity, so that it more easily penetrates into the space between the carrier substrate and the semiconductor chip. Moreover, by preheating the carrier substrate, the thermosetting resin composition is allowed to penetrate fully into the entire space between the carrier substrate and the semiconductor chip.

Thermosetting resin compositions of the present invention may ordinarily be cured by heating to a temperature in the range of about 120 to about 180° C. for a period of time of about 0.5 to 30 minutes. However, generally after application of the composition, an initial cure time of about 1 minute sets up the composition, and complete cure is observed after about 5 to about 15 minutes at 165° C. Thus, the composition of the present invention can be used at relatively moderate temperatures and short-time curing conditions, and, hence, achieve very good productivity.

The amount of thermosetting resin composition applied should be suitably adjusted so as to fill, almost completely, the space between the carrier substrate and the semiconductor chip, which amount, of course, may vary depending on application.

Cured reaction products of the thermosetting resin compositions of the present invention demonstrate excellent adhesive force, heat resistance, and electric properties, and acceptable mechanical properties, such as flex-cracking resistance, chemical resistance, moisture resistance, and the like, for the applications for which they are used herein.

Figure 2:
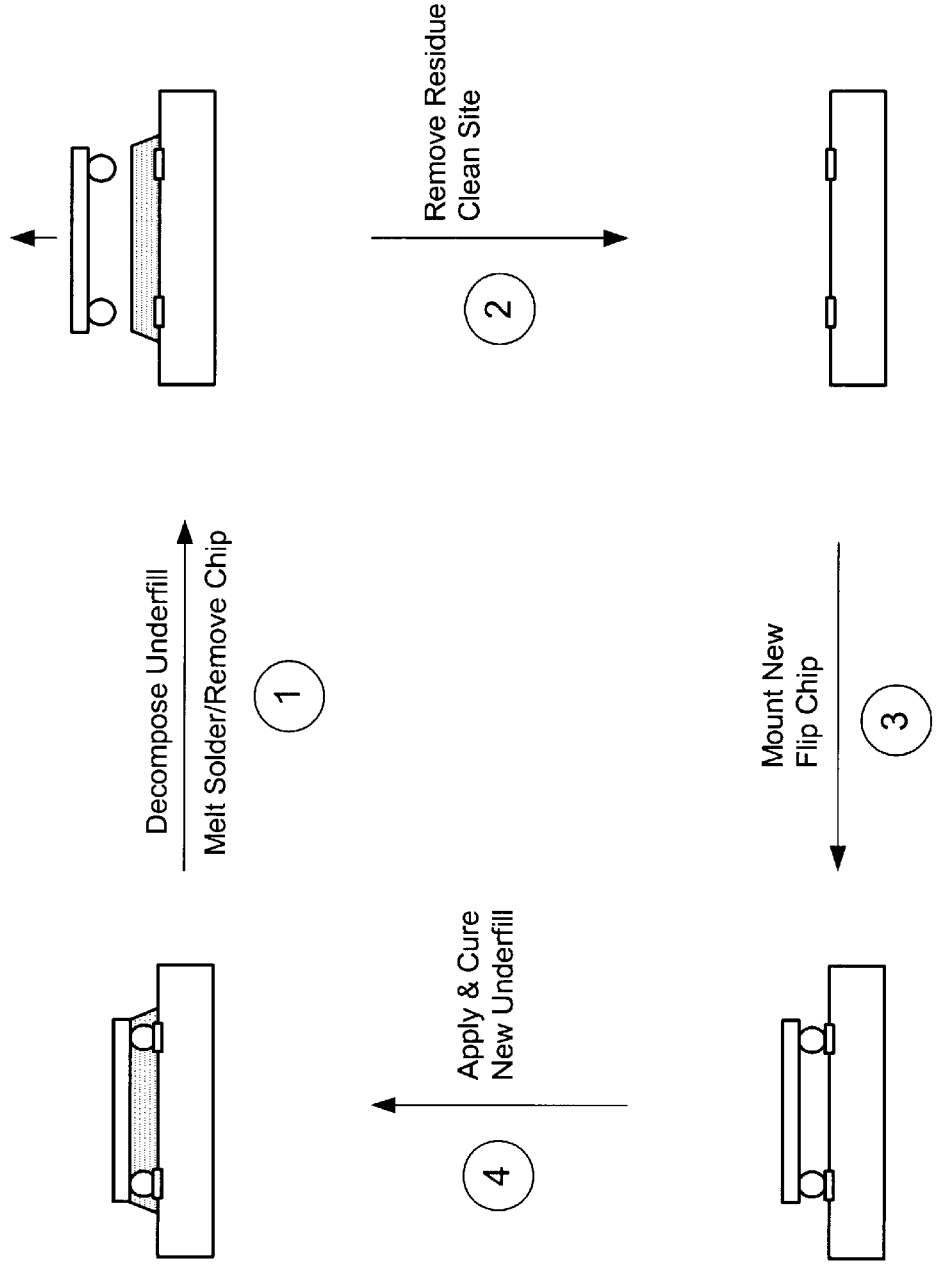
FIG. 2 depicts a flow diagram of a procedure useful to rework a cured thermosetting resin composition in accordance with the present invention, so as to remove a semiconductor device from a circuit board to which it had been attached.

In the mounting process by using the thermosetting resin composition of the present invention, after the semiconductor device is mounted on the circuit board as described above, the resulting structure is tested with respect to characteristics of the semiconductor device, connection between the semiconductor device and the circuit board, other electrical characteristics, and the state of sealing. In the event a failure is found, repair can be made in the following manner and as shown in the flow diagram depicted in FIG. 2.

The area around the semiconductor device which has failed is heated at a temperature of about 190 to about 260° C. for a period of time ranging from about 10 seconds to about 1 minute. (See FIG. 2, step 1.) Desirably, the temperature should be maintained in the range of about 210 to about 220° C. and the period of time should be within the 30 seconds to 1 minute range. Although no particular limitation is placed on the way in which heating occurs, localized heating is particularly desirable, such as the application of hot air to the failure site by a heating gun.

As soon as the solder is melted and the resin is softened by partial decomposition to cause a reduction in bond strength, the semiconductor device may be pulled apart and removed from the substrate, such as with tweezers or pliers.

After the semiconductor device 4 is removed, a residue of the cured reaction product of the thermosetting resin composition and a residue of the solder are left on the circuit board. The residue of the cured product of the thermosetting resin composition can be removed, for example, by scraping it off after the residue has been softened by heating it to a predetermined temperature.

The residue of the solder can be removed, for example, by use of a solder-absorbing braided wire. (See FIG. 2, step 2.)

Finally, a new semiconductor chip may be mounted again onto the circuit board (which has been cleaned as described above) in the manner as described above. (See FIG. 2, step 3.) Following mounting, a thermosetting resin composition in accordance with this invention may be dispensed in the area between the semiconductor device and the circuit board. (See FIG. 2, step 4.) Repair of the failure site is thus completed.

Where a failure site is found in the circuit board, the semiconductor device can be reused by removing the residue of the cured reaction product of the thermosetting resin composition and the residue of the solder left on the bottom of the semiconductor device in the same manner as described above.

The present invention will be more readily appreciated with reference to the examples which follow.

EXAMPLES

In these examples, compositions in accordance with the present invention were prepared and evaluated for performance.

Example 1

Synthesis of Epoxy Monomers Having Aromatic Secondary Linkage

An acid chloride was prepared as follows: anhydrous 3-cyclohexenecarboxylic acid (50 g, 0.4 mol) was placed in a 500 mL round-bottom flask and a few drops of N,N-dimethylformamide was added as a catalyst. To this was added dropwise thionyl chloride (58.4 mL, 0.8 mol), diluted with anhydrous toluene (50 mL), at room temperature and the reaction mixture was refluxed for 4 hours. The final product was fractionally distilled to yield 48.8 grams of 3-cyclohexenecarboxylic acid chloride at a yield of 85%.

A secondary alcohol was prepared by dissolving 1,2,3,6-tetrahydrobenzaldehyde (8.8 mL, 8,262 grams, 0.075 mol) in anhydrous tetrahydrofuran (THF) (100 mL). Phenyl magnesium bromide (1 M-THF solution, 100 mL) was added dropwise at a temperature of 0° C. After stirring for 12 hours at room temperature, the reaction was quenched by pouring the reaction mixture over a cold saturated aqueous ammonium chloride solution. The organic phase was separated, washed with diethyl ether and distilled water, and then dried over magnesium sulfate. After purification by recrystallization from hexane, a secondary alcohol of α,α,α', α'-phenyl-3-cyclohexene-1-methanol was obtained.

8 grams (42.6 mmol) of this secondary alcohol of α,α,α', α'-phenyl-3-cyclohexene-1-methanol was dissolved in anhydrous pyridine (6 mL) and the solution was cooled in an ice/water bath. 6.46 grams (44.7 mmol) of the 3-cyclohexenecarboxylic acid chloride as prepared were combined in solution with 0.88 grams (7.2 mmol) of 4-(dimethylamino)pyridine in 35 mL of anhydrous methylene chloride and was added dropwise. The mixture was stirred at room temperature overnight and then washed with 2 N HCl to remove pyridine/HCl salt. The organic phase was separated, washed with saturated sodium bicarbonate and sodium chloride solution, and then dried over magnesium sulfate. The crude product was purified by recrystallization from methanol to yield white needles.

To epoxidize the reaction product, 5.06 grams (17.1 mmol) of this reaction product was dissolved in 150 mL of chloroform, and 16.5 grams (average 71.5 weight %, 68.4 mmol) of 3-chloroperoxybenzoic acid was added slowly to the solution and cooled in an ice/water bath. After stirring for 48 hours at room temperature, the reaction mixture was filtered. 5 weight % of NaOH solution was slowly added to the filtered solution. The organic phase was separated, washed with saturated NaCl solution and then dried over magnesium sulfate. After purification by column chromatography, a colorless liquid was obtained, having the following structural formula:

XII

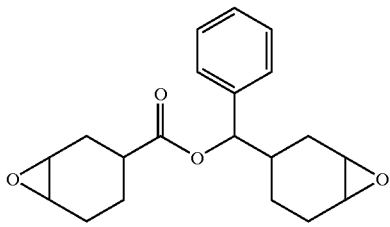

This procedure was repeated, with the exception that tolylmagnesium bromide was employed in place of phenylmagnesium bromide during synthesis of the secondary alcohol, to form a tolyl secondary alcohol, α,α,α', α'-tolyl-3-cyclohexene-1-methanol. The final reaction product was obtained, having the following structural formula:

XIII

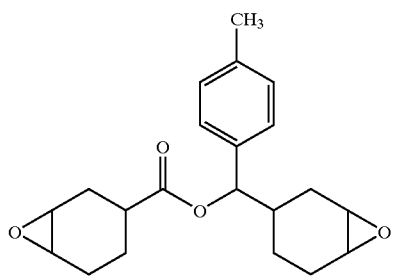

Physical Properties of Cured Epoxy Monomers Having Aromatic Secondary Linkage The epoxy monomers of formulas XII and XIII as prepared were cured by reacting with an acid anhydride. The cured compositions of each formula are noted in Table 1 as Sample Nos. 1 and 2, respectively. A cycloaliphatic epoxy monomer having a primary ester was prepared and cured in the same manner. The cured composition is noted in Table 1 as Sample No. 3. The physical properties of such cured epoxy compositions are set forth in Table 1.

TABLE 1

| Sample No. | Tg, ° C. | Flexible Modulus, Below Tg (Mpa) | Flexible Modulus, Above Tg (MPa) |
|---|---|---|---|
| 1 | 212 | 2600 | 22 |
| 2 | 219 | 1500 | 20 |
| 3 | 212 | 1500 | — |

Both the cycloaliphatic epoxy monomer having a primary ester (Sample No. 3) and the epoxy monomers with aromatic secondary esters (Sample Nos. 1 and 2) exhibited similar reactivity during acid anhydride curing, and as can be seen from the results shown in Table 1, exhibited similar properties under the same conditions. The decomposition temperature of the epoxy monomers with aromatic secondary esters was found to be much lower than that of the cycloaliphatic epoxy monomer having a primary ester under similar conditions. As such, reworkable compositions can be prepared from epoxy monomers with aromatic secondary esters as underfill materials for high temperature applications. Thus, curable reworkable underfills can be prepared with reworking temperatures tailored to suit specific needs.

Example II

Synthesis of Epoxy Monomers With Aliphatic tert-Ester Linkages

A solution of 5-hexen-1-one (17.76 g., 0.18 mol) in 50 mL of anhydrous THF was added dropwise to a flask containing 129 mL of a 1.4 M methyllithium solution in diethyl ether (0 18 mol) at −78° C. After stirring for 2 hours at −78° C., a solution of isophthaloyldichloride (12.2 grams of 0.06 mol) dissolved in 100 mL of THF was added to the reactor, and the reaction mixture was allowed to warm to room temperature. After stirring overnight, the reaction mixture was washed with 10% sodium bicarbonate solution and then with water, and the organic phase was dried over mangesium sulfate. The product was purified by flash chromatography.

Epoxidation of the terminal alkenyl group was carried out using a similar procedure [Immuta, M; Ziffer, H. *J Org. Chem.*, 44 1351, (1979)]. To a stirred solution of the reaction product obtained was added 1 grams of meta-chloroperoxybenzoic acid in small portions over a 10 min period at ~0° C. After stirring for 12 hours, 1 grams of meta-chloroperoxybenzoic acid was replenished. After additional stirring for 12 hours, the organic phase was separated, washed with saturated sodium thiosulfate and water, and dried over magnesium sulfate. After evaporation of solvent, the crude product was purified by flash chromatography to obtain a colorless oil having the following formula:

X

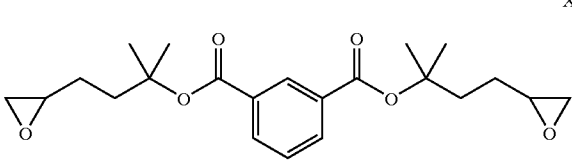

This procedure was repeated with the exception that terephthaloylchloride was employed in place of isophthaloyldichloride. After flash chromatography, an epoxy member was obtained as white solid having the following formula:

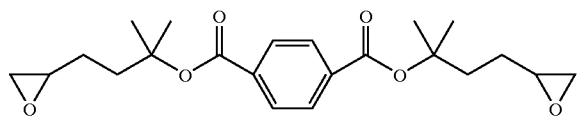

XI

Synthesis of Epoxy Monomers With Cumyl Type tert-Ester Linkages

α,α,α', α'Tetramethyl-1,3-benzenedimethanol [5.05 grams (26 mmol)] was dissolved in 150 mL of anhydrous THF, and to this was added under an argon atmosphere 35 mL of 1.6 M n-butyllithium in hexane (56 mmol) to prepare lithium tert-alkoxide. After stirring for 2 hours, a solution of 6.4 grams (54 mmol) of 4-pentenoyl chloride in 70 mL of anhydrous THF was added dropwise to the stirred mixture. After stirring for 12 hours, the reaction mixture was hydrolyzed by adding 100 mL of water. The aqueous phase was extracted with three 50 mL portions of ethyl ether, and the combined organic phase was dried over mangesium sulfate. The product was purified by flash chromatography.

Epoxidation of the terminal alkenyl group was carried out as described above. An epoxy monomer was obtained as a colorless oil after flash chromatography having the following formula:

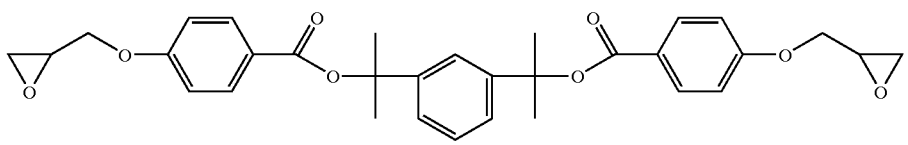

IV

This procedure was repeated with the exception that α,α,α', α'-tetramethyl-1,4-benzenedimethanol is employed in place of of α,α,α', α'tetramethyl-1,3-benzenedimethanol. An epoxy monomer was obtained as a colorless oil after flash chromatography having the following formula:

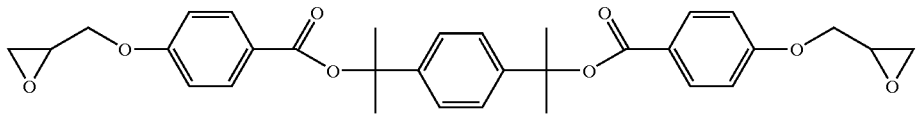

V

Physical Properties of Cured Epoxy Monomers Having tert-Ester Linkages

The epoxy monomers represented by formulas X, XI, IV and V as prepared above were cured by reacting with an acid anhydride, hexahydro-4-methylphthalic anhydride ("HHMPA") as curing agent, ethylene glycol as initiator, and benzyldimethylamine as a catalyst to form Sample Nos. 4, 5, 6 and 7, respectively. The epoxy monomers as prepared were also cured with an aromatic amine, MDA, as well as a cycloaliphatic amine, MCA.

All of the samples formulated with the epoxy monomers represented by formulas X, XI, IV and V exhibited excellent properties as useful reworkable compositions. The decomposition temperature of samples based on the epoxy monomers with aliphatic tert-ester linked by a bisbenzoate group (Sample Nos. 4 and 5) exhibited significantly higher decomposition temperatures than the epoxy monomers having cumyl ester linkages within the network structure (Sample Nos. 6 and 7). Further, while the epoxy monomers cured with MDA and MCA exhibited very similar decomposition behavior, the epoxy monomers cured with HHMPA exhibited significantly lower decomposition temperature. As such, reworkable compositions can be prepared as underfill materials tailored to suit specific needs.

The samples described above are presented as illustrative, rather than limiting, examples of the inventive compositions. Many additional embodiments thereof are included in the spirit and scope of the invention, which is defined by the claims.

What is claimed is:

1. A curable composition which is reworkable through thermal decomposition under exposure to temperature conditions in excess of those used to cure the composition, said curable composition comprising a compound having at least one thermally cleavable linkage and being selected from the group consisting of:

a)

I

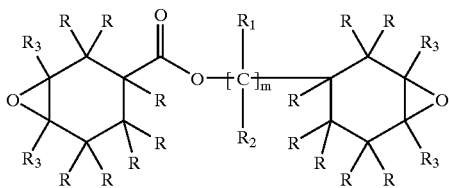

where each R is independently selected from hydrogen, methyl, ethyl, propyl, isopropyl, butyl, isobutyl, t-butyl, $C_{1-4}$ alkoxy, halogen, cyano and nitro, and each $R_3$ is independently selected from hydrogen, methyl, ethyl, propyl, and isopropyl, $R_1$ and $R_2$ are each independently selected from hydrogen, methyl, ethyl, propyl, phenyl, tolyl, and benzyl, provided that at least one of $R_1$ and $R_2$ is phenyl, tolyl or benzyl, and m is 1;

b)

III

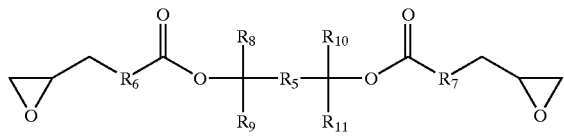

where $R_5$ is phenylene, $R_6$ and $R_7$ are each independently selected from methylene, ethylene, propylene, or phenylene; $R_8$ and $R_9$ are each independently selected hydrogen, methyl, ethyl, and propyl, provided that both $R_8$ and $R_9$ cannot be hydrogen; and $R_{10}$ and $R_{11}$ are each independently selected from hydrogen, methyl, ethyl and propyl, provided that both $R_{10}$ and $R_{11}$ cannot be hydrogen; and c)

VIII

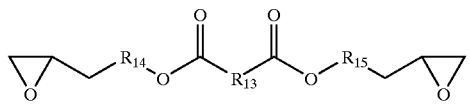

where $R_{13}$ is phenylene, and $R_{14}$ and $R_{15}$ are independently selected from secondary or tertiary aliphatic moieties.

2. A curable composition as in claim 1, wherein said compound having at least one thermally cleavable linkage is (a), and is represented by the formula:

II

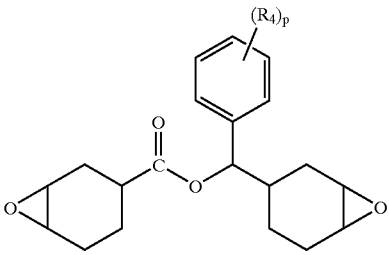

where $R_4$ is hydrogen, methyl, ethyl, propyl, or tert-butyl, and p is 1–5.

3. A curable composition as in claim 1, wherein said compound having at least one thermally cleavable linkage is (b), and is selected from the group consisting of:

IV

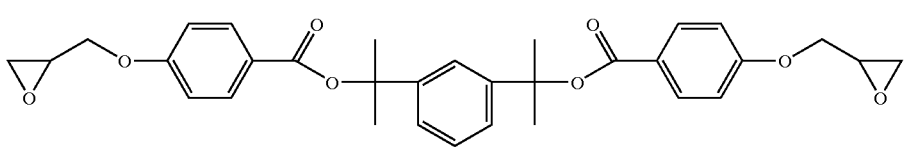

V

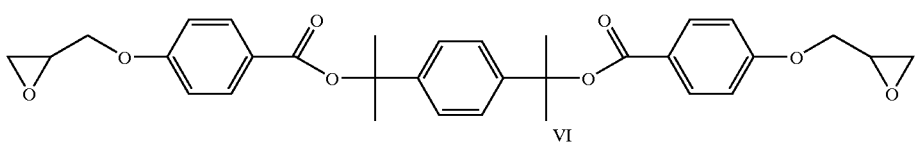

VI

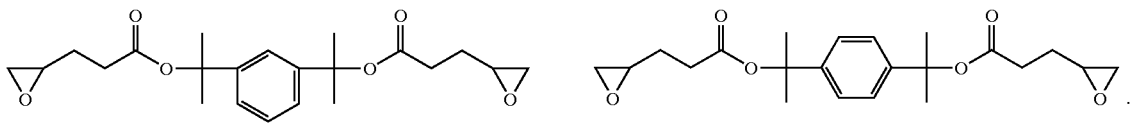

VII

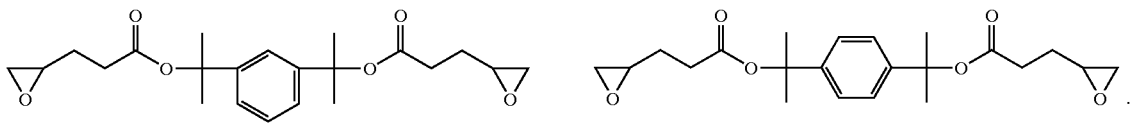

.

4. A curable composition as in claim 1, wherein said compound having at least one thermally cleavable linkage is (c), and is represented by the formula:

IX

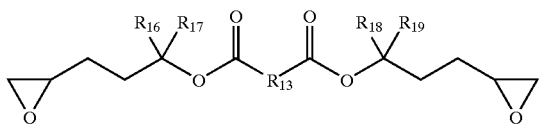

where $R_{13}$ is phenylene, $R_{16}$ and $R_{17}$ are each independently selected from hydrogen, methyl, ethyl or propyl, provided that both $R_{16}$ and $R_{17}$ cannot be hydrogen; and $R_{18}$ and $R_{19}$ are each independently selected from hydrogen, methyl, ethyl or propyl, provided that both $R_{18}$ and $R_{19}$ cannot be hydrogen.

5. A curable composition as in claim 4, wherein said compound having at least one thermally cleavable linkage is selected from the group consisting of:

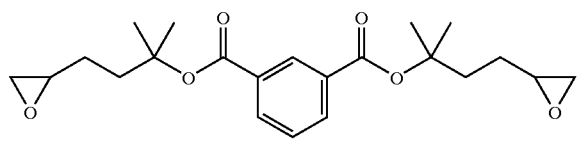

X

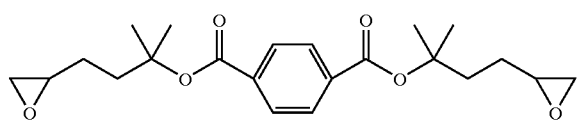

XI

6. A thermosetting resin composition, reaction products of which are capable of softening and losing their adhesiveness under exposure to temperature conditions in excess of those used to cure the composition, said composition comprising:

(a) a curable resin component, at least a portion of which comprises a curable compound having at least one thermally cleavable linkage, said curable compound selected from the group consisting of:

i)

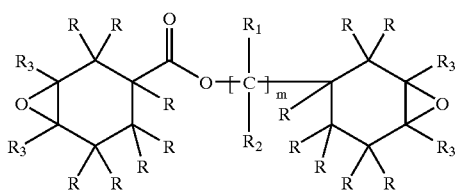

I where each R is independently selected from hydrogen, methyl, ethyl, propyl, isopropyl, butyl, isobutyl, tert-butyl, $C_{1-4}$ alkoxy, halogen, cyano and nitro; each $R_3$ is independently selected from hydrogen, methyl, ethyl, propyl; and isopropyl, $R_1$ and $R_2$ are each independently selected from hydrogen, methyl, ethyl, propyl, phenyl, tolyl, and benzyl, provided that at least one of $R_1$ and $R_2$ is phenyl, tolyl or benzyl, and m is 1;

ii)

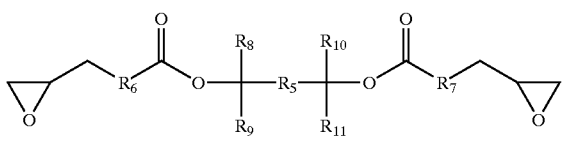

III where $R_5$ is phenylene, $R_6$ and $R_7$ are each independently selected from methylene, ethylene, propylene, or phenylene; $R_8$ and $R_9$ are each independently selected hydrogen, methyl, ethyl, and propyl, provided that both $R_8$ and $R_9$ cannot be hydrogen; and $R_{10}$ and $R_{11}$ are each independently selected from hydrogen, methyl, ethyl and propyl, provided that both $R_{10}$ and $R_{11}$ cannot be hydrogen; and iii)

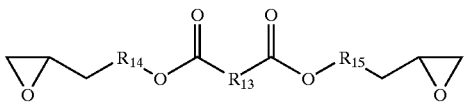

VIII where $R_{13}$ is phenylene, and $R_{14}$ and $R_{15}$ are independently selected from secondary or tertiary aliphatic moieties;

(b) optionally, an inorganic filler component; and
(c) a curing agent component comprising a member selected from the group consisting of anhydride compounds, amine compounds, amide compounds, imidazole compounds, and combinations thereof.

7. The composition according to claim 6, wherein the compound having at least one thermally cleavable linkage may be chosen from those within the following

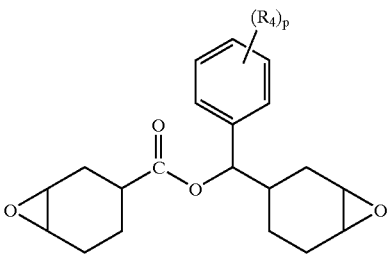

II formula:
wherein $R_4$ is selected from hydrogen, methyl, ethyl, propyl and tert-butyl, and p is 1–5.

8. The composition according to claim 6, wherein the compound having at least one thermally cleavable linkage may be chosen from those within the following formula:

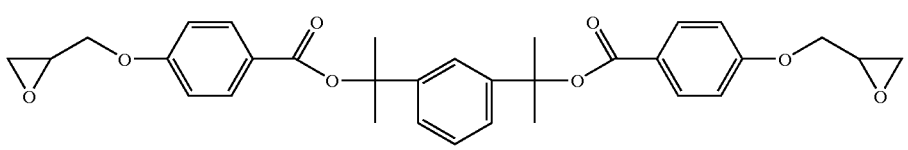

IV

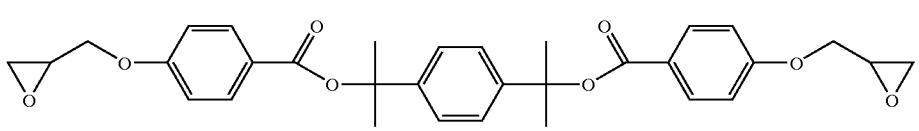

V

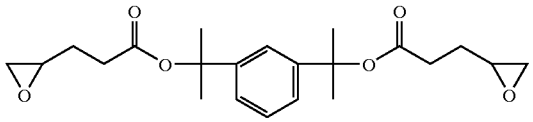
VI

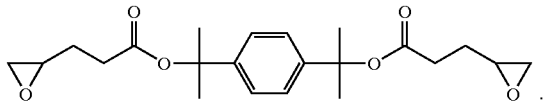
VII

9. The composition according to claim 6, wherein the compound having at least one thermally cleavable linkage may be chosen from those within the following formula:

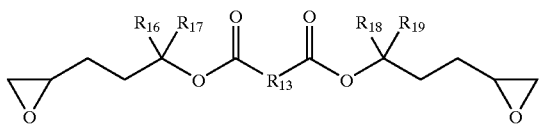
IX where $R_{13}$ is phenylene, $R_{16}$ and $R_{17}$ are each independently selected from hydrogen, methyl, ethyl or propyl, provided that both $R_{16}$ and $R_{17}$ cannot be hydrogen; and $R_{18}$ and $R_{19}$ are each independently selected from hydrogen, methyl, ethyl or propyl, provided that both $R_{18}$ and $R_{19}$ cannot be hydrogen.

10. The composition according to claim 9, wherein the compound having at least one thermally cleavable linkage may be chosen from those within the following formula:

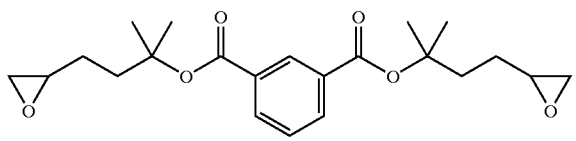
X

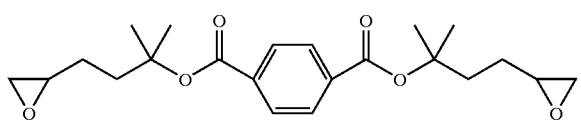
XI

11. The composition according to claim 6, further comprising a flowability agent.

12. The composition according to claim 11, wherein the flowability agent is a member selected from the group consisting of silanes, titanates and combinations thereof.

13. The composition according to claim 6, further comprising an adhesion promoter.

14. The composition according to claim 13, wherein the adhesion promoter is a member selected from the group consisting of glycidyl trimethoxysilane, gamma-amino propyl triethoxysilane, and combinations thereof.

15. The composition according to claim 6, further comprising a cyanate ester.

16. The composition according to claim 15, wherein the cyanate ester is a member selected from the group consisting of dicyanatobenzenes, tricyanatobenzenes, dicyanatonaphthalenes, tricyanatonaphthalenes, dicyanatobiphenyl, bis(cyanatophenyl)methanes and alkyl derivatives thereof, bis(dihalocyanatophenyl)propanes, bis(cyanatophenyl)ethers, bis(cyanatophenyl)sulfides, bis(cyanatophenyl)propanes, tris(cyanatophenyl)phosphites, tris(cyanatophenyl)phosphates, bis(halocyanatophenyl)methanes, cyanated novolac, bis[cyanatophenyl (methylethylidene)]benzene, cyanated bisphenol-terminated thermoplastic oligomers, and combinations thereof.

17. The composition according to claim 6, wherein the inorganic filler component may be selected from the group consisting of materials constructed of or containing reinforcing silicas, aluminum oxide, silicon nitride, aluminum nitride, silica-coated aluminum nitride, boron nitride, and combinations thereof.

18. The composition according to claim 6, wherein the inorganic filler component has a low ion concentration and a particle size in the range of about 2–10 microns.

19. The composition according to claim 6, wherein the anhydride compounds of the curing agent component may be selected from the group consisting of hexahydrophthalic anhydride, methyl hexahydrophthalic anhydride, 5-(2,5-dioxotetrahydrol)-3-methyl-3-cyclohexene-1,2-dicarboxylic anhydride, and combinations thereof.

20. The composition according to claim 6, wherein the amine compounds of the curing agent component may be selected from the group consisting of dicyandiamide, diethylenetriamine, triethylenetetramine, diethylaminopropylamine, m-xylenediamine, diaminodiphenylamine, isophoronediamine, menthenediamine, polyamides, 4,4'-methylenedianiline, 4,4'-methylenebis(cyclohexylamine), and combinations thereof.

21. The composition according to claim 6, wherein the amide compounds of the curing agent component may be selected from the group consisting of dicyandiamide and combinations thereof.

22. The composition according to claim 6, wherein the imidazole compounds of the curing agent component may be selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, addition products of an imidazole and trimellitic acid, addition products of an imidazole and 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-napnthyl-4,5-diphenylimidazole, 1-benzyl-2-methylimidazole, 2-p-methoxystyrylimidazole, and combinations thereof.

23. The composition according to claim 6, wherein the curing agent component is used in an amount of from about 3 to about 60 parts by weight, per 100 parts by weight of the curable resin.

24. The composition according to claim 6, wherein the curing agent component is used in an amount of from about 5 to about 40 parts by weight, per 100 parts of the curable resin.

25. The composition according to claim 11, wherein the flowability agent is selected from octyl trimethoxy silane, methacryloxy propyl trimethoxy silane, titanium IV tetrakis [2,2-bis[(2-propenyloxy)methyl]-1-butanolato-O][bis (ditridecylphosphito-O), dihydrogen]$_2$, and combinations thereof.

26. The composition according to claim 11, wherein the flowability agent is used in an amount up to about 2 parts by weight, per 100 parts of the curable resin.

27. The composition according to claim 6, having a viscosity in the range of about 500–70,000 cps.

28. The composition according to claim 6, wherein said composition is capable of sealing underfilling between a semiconductor device including a semiconductor chip mounted on a carrier substrate and a circuit board to which said semiconductor device is electrically connected.

29. A thermosetting resin composition capable of sealing underfilling between a semiconductor device including a semiconductor chip mounted on a carrier substrate and a circuit board to which said semiconductor device is electrically connected, reaction products of which are capable of softening and losing their adhesiveness under exposure to temperature conditions in excess of those used to cure the composition, said composition comprising:

(a) a curable resin component, a portion of which comprises a curable compound having at least one thermally cleavable linkage and present in an amount within the range of about 20 to 65 weight percent, based on the total weight of the composition, said curable compound being selected from the group consisting of:

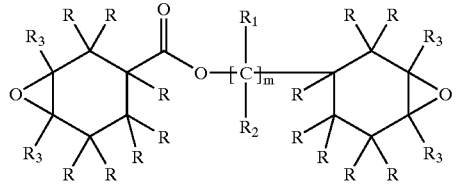

where each R is independently selected from hydrogen, methyl, ethyl, propyl, isopropyl, butyl, isobutyl, t-butyl, $C_{1-4}$ alkoxy, halogen, cyano and nitro; each $R_3$ is independently selected from hydrogen, methyl, ethyl, propyl, and isopropyl; $R_1$ and $R_2$ are each independently selected from hydrogen, methyl, ethyl, propyl, phenyl, tolyl, and benzyl, provided that at least one of $R_1$ and $R_2$ is phenyl, tolyl or benzyl, and m is 1;

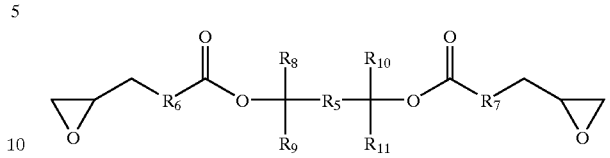

where $R_5$ is phenylene, $R_6$ and $R_7$ are each independently selected from methylene, ethylene, propylene, or phenylene; $R_8$ and 9 are each independently selected from hydrogen, methyl, ethyl, and propyl, provided that both $R_8$ and $R_9$ cannot be hydrogen; and $R_{10}$ and $R_{11}$ are each independently selected from hydrogen, methyl, ethyl and propyl, provided that both $R_{10}$ and $R_{11}$ cannot be hydrogen; and

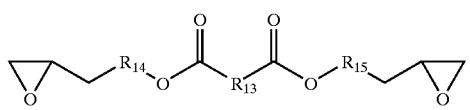

where $R_{13}$ is phenylene, and $R_{14}$ and $R_{15}$ are independently selected from secondary or tertiary aliphatic moieties;

(b) an inorganic filler component in an amount up to about 60 weight percent, based on the total weight of the composition;

(c) a curing agent component in an amount within the range of 2 to about 50 weight percent, based on the total weight of the composition; and (d) a flowability agent in an amount up to about 0.5 weight percent, based on the total weight of the composition.

30. Reaction products formed from the compositions according to claim 1.

31. An electronic device comprising a semiconductor device and a circuit board to which said semiconductor device is electrically connected which is assembled using a thermosetting resin composition according to claim 1 as an underfill sealant between the semiconductor device and the circuit board, wherein reaction products of the composition are capable of softening and losing their adhesiveness under exposure to temperature conditions in excess of those used to cure the composition.

* * * * *

UNITED STATES PATENT AND TRADEMARK OFFICE
CERTIFICATE OF CORRECTION

PATENT NO.   : 6,657,031 B1
DATED        : December 2, 2003
INVENTOR(S)  : Lawrence N. Crane et al.

It is certified that error appears in the above-identified patent and that said Letters Patent is hereby corrected as shown below:

Column 21,
Line 52, "selected hydrogen" should read -- selected from hydrogen --.

Column 28,
Line 15, "$R_8$ and 9" should read -- $R_8$ and $R_9$ --.

Signed and Sealed this

Sixth Day of July, 2004

JON W. DUDAS
*Acting Director of the United States Patent and Trademark Office*